United States Patent
Zemel

(10) Patent No.: US 6,483,574 B1
(45) Date of Patent: Nov. 19, 2002

(54) LITHOGRAPHY SYSTEM WITH VARIABLE AREA SUBSTRATE TILING

(75) Inventor: Marc I. Zemel, Bedminster, NJ (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 09/493,413

(22) Filed: Jan. 29, 2000

(51) Int. Cl.[7] .................. G03B 27/58; G03B 27/42; G03B 27/62
(52) U.S. Cl. ................ 355/72; 355/53; 355/75
(58) Field of Search .............. 355/53, 30, 72–76; 378/34–35; 310/10, 12

(56) References Cited

U.S. PATENT DOCUMENTS

| | | | | |
|---|---|---|---|---|
| 4,443,098 A | * | 4/1984 | Walwyn et al. | 355/74 |
| 5,485,495 A | * | 1/1996 | Miyachi et al. | 378/34 |
| 6,211,945 B1 | * | 4/2001 | Baxter et al. | 355/53 |

* cited by examiner

Primary Examiner—Hung Henry Nguyen
(74) Attorney, Agent, or Firm—Carl C. Kling

(57) ABSTRACT

A dockable substrate chuck and demountable substrate frame, which can be placed atop the dockable substrate chuck, effectively extend the moving platform of an X-Y stage to access a larger substrate area. The system features a substrate chuck docking fixture. The dockable substrate chuck selectively grips or glides on a grip/glide plate on the stage. A bridge suspends the optics and Z-movable kinematic elements of a substrate chuck docking fixture. The docked dockable substrate chuck is fixed in space, in glide mode on a temporary air bearing. When the stage carriage reaches a new position with respect to the dockable substrate chuck, the substrate chuck docking fixture is turned off, and the puck of the dockable substrate chuck regains its grip on the grip/glide plate. The dockable substrate chuck is newly positioned on the stage, the demountable substrate frame is located with respect to the dockable substrate chuck, and the dockable substrate chuck vacuum grips the substrate for a high resolution scan.

1 Claim, 5 Drawing Sheets

LITHOGRAPHY SYSTEM WITH VARIABLE AREA SUBSTRATE TILING

CROSS-REFERENCE TO RELATED APPLICATIONS (NOT APPLICABLE)

STATEMENT REGARDING FEDERALLY SPONSORED RESEARCH OR DEVELOPMENT (NOT APPLICABLE)

REFERENCE TO A MICROFICHE APPENDIX (NOT APPLICABLE)

BACKGROUND OF THE INVENTION (1) Field of the Invention

This invention relates to indexing in a high-resolution microlithographic system using a substrate docking fixture when repositioning to a selected module for patterning, in turn, a number of substrate modules of a large substrate, characterized by a substrate chuck docking fixture in a kinematic engagement with a substrate chuck, together with a grip/glide air-bearing plate on the carriage of a precision X-Y stage.

(2) Description of the Related Art

There are a number of modern techniques for providing a seamless composite image on a large substrate, which techniques are characterized by a scan of small-field exposures using a laser. Optical requirements mandate the use of a small image field, but repeated exposures by a small image field must flow seamlessly into each other, or there will be a condition of gaps and overlaps. The best known technique to fulfill the requirements for high-resolution, seamless imaging of large substrates is the Anvik technique of overlapping complementary polygonal scans, generally using overlapping hexagons. Informative patents include the following:

U.S. Pat. No. 4,924,257, Jain, issued May 8, 1990, SCAN AND REPEAT HIGH RESOLUTION LITHOGRAPHY SYSTEM, filed Oct. 5, 1988. This patent shows overlapping complementary polygonal scans for seamless patterning.

U.S. Pat. No. 5,897,986, Dunn, Farmiga & Jain, issued Apr. 27, 1999, PROJECTION PATTERNING OF LARGE SUBSTRATES USING LIMITED-TRAVEL PRECISION X-Y STAGE, Ser. No. 08/864,160, filed May 28, 1997. Dunn et al. shows a substrate docking fixture usable in a lithography system using overlapping complementary polygonal scans for variable area substrate tiling. This technology presents, in turn, a number of different modules of a substrate for seamless imaging of the mask, one module at a time, by scanning a small image field from mask to substrate module under control of an X-Y stage before repositioning for the next module.

BRIEF SUMMARY OF THE INVENTION

This invention relates to a microelectronics patterning system with a kinematic engagement to a grip/glide substrate chuck, as a substrate chuck docking fixture, together with an air bearing grip/glide plate, to maintain control during glide-mode repositioning of a large substrate, repetitively, to a number of different substrate module location, for patterning. After a module is scanned, the substrate chuck docking fixture facilitates easy gliding of the substrate, with respect to the stage, during repositioning to a new module. The substrate, temporarily docked on the substrate chuck docking fixture while the X-Y stage moves, is again gripped to the stage carriage, at the next module position, for patterning of the next module.

It is the object of the invention to provide a substrate chuck, with an air/vacuum puck, for selectively presenting the substrate for rapid-motion scanning of a module, then providing an air bearing allowing the substrate chuck to remain fixed in space, while the X-Y stage moves under it, to bring a new module into position for rapid-motion scanning.

Another object of the invention to provide a substrate chuck docking fixture, which has the capability of engaging the substrate chuck and subsequently releasing the substrate chuck, with repeatable high resolution in X, Y and Theta, at a different position with regard to the X-Y stage carriage.

Another object of the invention is to provide a manufacturable substrate chuck docking fixture with high resolution and with long time between overhauls.

Another object of the invention is to provide a rigid bridge to support a kinematic engagement with the substrate chuck docking fixture, thereby facilitating highly repeatable engagement during repositioning.

A feature of the invention is the provision in the substrate chuck of a limited-size air-bearing puck, providing easy repositioning of the substrate chuck on a large lightweight grip/glide plate on the stage carriage.

Another feature of the invention is the provision of a demountable substrate frame for quick reloading of the substrate chuck, and consequent quick resupply of a fresh substrate to the system.

A more detailed feature of the invention is the provision in a kinematic engagement of a set of shock-resistant standard aligners, each aligner comprising an actuator, a hardened and polished ball, a flexure mechanism for maintaining ball position, and a hardened and polished veegroove receptor for the ball.

Another feature of the invention is the grip/glide subsystem of the grip/glide plate and the substrate chuck which selectively stands or rides on its air/vacuum puck on the grip/glide plate.

A more specific feature of the invention is the placement of the kinematic engagement partly on the bridge of a large-area substrate imaging system and partly on the substrate chuck.

Still another specific feature of the invention is the substrate frame, which allows the pre-loading of substrates of varying sizes onto the substrate frame prior to positioning of the pre-loaded substrate frame onto the carriage of the stage.

An advantage of the invention is that a relatively easy-to-manufacture substrate chuck with an air/vacuum puck can control a large area substrate, during both substrate scanning activity and substrate module shifting activity using a substrate chuck docking fixture.

Another advantage of the invention is that the system can be controlled to pattern a variety of substrate module sizes, using a single substrate chuck with a set of substrate frames.

An advantage of the invention is that a relatively easy-to-manufacture bridge and a substrate chuck subsystem, with a related three-ball, three-receptor kinematic engagement as a substrate chuck docking fixture, can repeatedly engage and release a substrate with respect to a fast-scan high-precision stage, in the context of patterning of a large substrate with overlapping complementary polygonal scans.

Another advantage of the invention is that the system architecture is modular, lends itself to easy accessibility, has a satisfactory capture range, has easy component replacement and provides minimal vibration.

Still another advantage of the invention is that only a small portion of the substrate chuck docking fixture mass is carried by the stage, adding very little weight to the stage subsystem.

Other objects, features and advantages of the invention will be apparent from the following written description, claims, abstract and the annexed drawings.

DETAILED DESCRIPTION OF THE INVENTION

The usual function of the bridge, in optical patterning systems of the type using a stage to provide scanning motion to the substrate with respect to the optics, is to provide rigid support for optics which are fixed in space with respect to the substrate. The substrate, on the moving carriage of a stage, is moved in a scanning motion while optics remain fixed in space.

Stringent optical requirements may mandate that large-area substrate be scanned in small area modules rather than all at once. The preferred technique is to scan a module, suspend the substrate in a substrate chuck docking fixture, and move the stage carriage to operating position for the next module. The requirement is to provide a manufacturable system which is both effective and economical.

Figure 1:
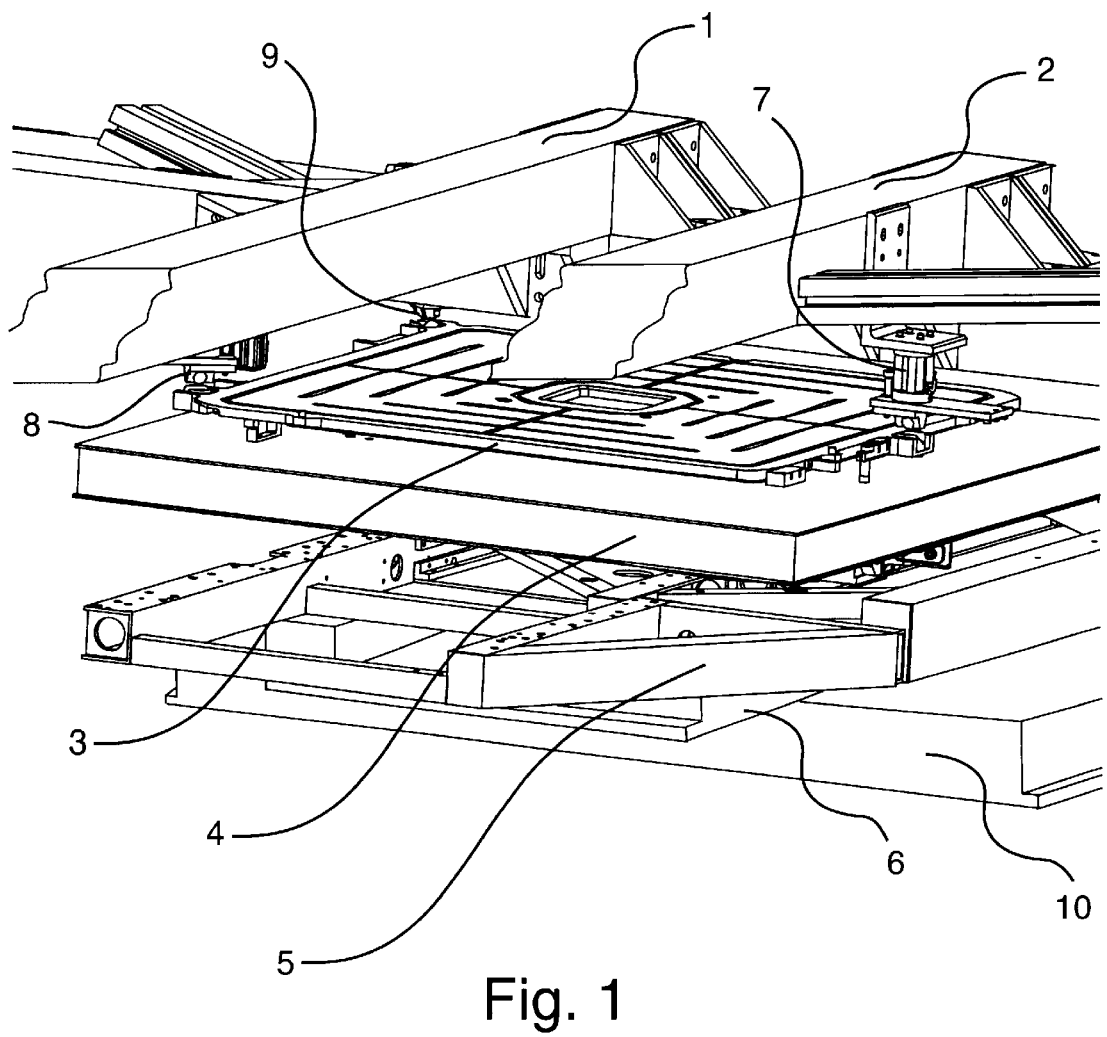
FIG. 1 is a perspective view of a microlithography system incorporating the substrate chuck, the grip-glide plate, and the substrate chuck docking feature of the invention.

FIG. 1 shows the structure of the bridge, substrate chuck, grip-glide plate on the stage carriage, and substrate chuck docking fixture of this invention. The bridge preferably has spans 1 and 2, and retains the function of supporting the optics of the final portion of the light path while permitting limited free motion of a substrate chuck 3 on grip/glide plate 4 on a scanning carriage 5 of an X-Y stage 6. The grip/glide plate is preferably a carbon-fiber-epoxy composite structure lapped to be smooth and planar. These elements cooperate to move the substrate (not shown) with respect to the bridge and the optical elements (not shown) supported by the bridge. In addition, the bridge supports portions 7, 8 and 9 of a substrate chuck docking fixture to provide, with high resolution, access in turn to a sequence of substrate modules. Substrate modules may be as simple as designated areas within the large substrate which is to be scanned.

Referring to FIG. 1, the bridge comprises spans 1 and 2, which are supported by vertical posts and stiffening brackets as required. The entire bridge is supported on base 10, which is preferably a heavy monolith of heavy stone, for example granite. The base 10 provides both a thermally stable structural base and a large mass to attenuate vibration. Optics (not shown) hang from bridge spans 1 and 2, and may also hang from miscellaneous support structures such as support plates.

Description of Indexing System

Figure 2:
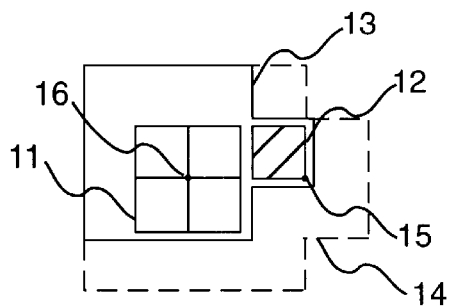
FIGS. 2a–2d are stylized diagrammatic plan views of a microlithography system incorporating the substrate chuck docking feature of the invention, showing how a single mask is used for image patterning on a plurality of substrate modules.
Figure 2:
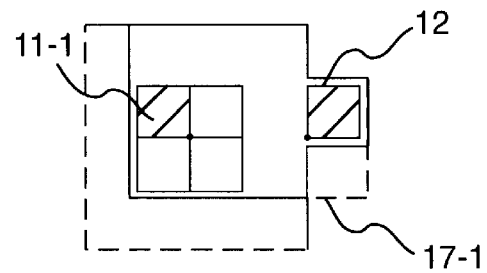
Figure 2:
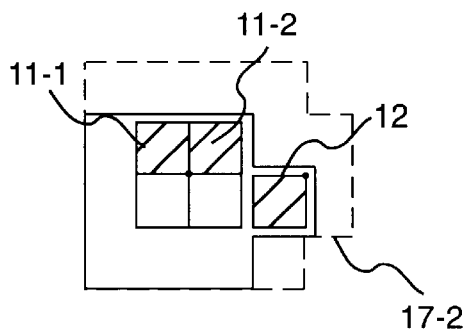
Figure 2:
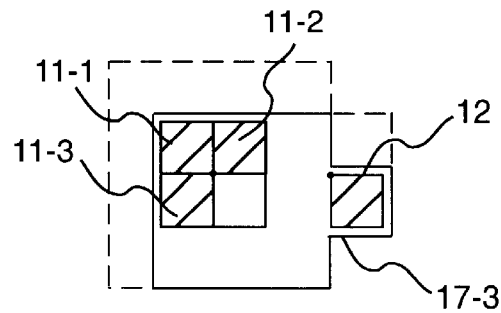

The single planar stage provides a carriage for the method to populate the substrate with modules of various sizes. This multiple-up patterning system enables the user to place multiple patterns of the same or different sizes on one substrate. This is achieved by indexing the substrate to different positions with respect to the mask, which is held in mask support means on the scanning carriage. FIGS. 2(a–d) show the substrate indexed for access to a selected portion (shaded). The selected substrate portion is presented to the imaging system for exposure. In these figures, a simple 4-up tiling of approximately 30 cm.×30 cm. modules is shown. In actuality, module size may vary depending on the size of the substrate chuck 3.

A key feature is the use of the substrate chuck docking fixture to immobilize the substrate temporarily while the stage moves to a new relative position with the mask. The substrate chuck docking fixture then releases the substrate, enabling a new region of the substrate to be patterned.

Another key feature is the use of the glide and grip system to enable the substrate to float over the scanning carriage during indexing, and to become rigidly fixed on the scanning carriage at all other times. These two features are shown in FIGS. 2(a–d).

Figure 3:
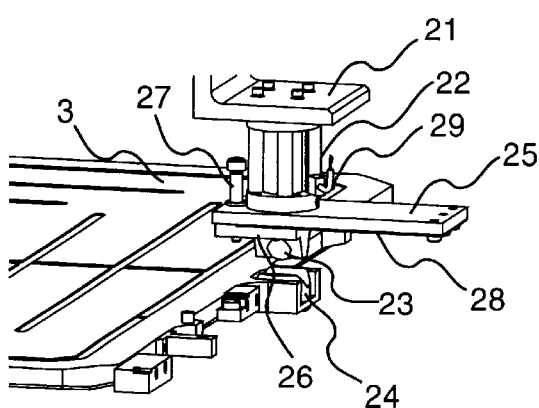
FIGS. 3a–3b are stylized perspective views of the kinematic system docking feature of the invention.
Figure 3:
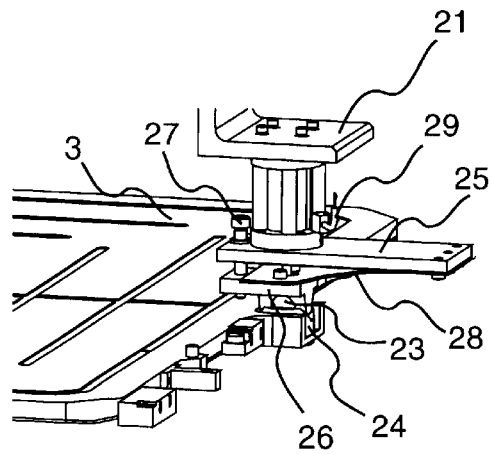

The substrate chuck docking fixture feature consists of three ball-tipped actuators 7, which are mounted to the bridge spans 1 & 2, and three vee-groove receptors 24, which are mounted to the substrate chuck 3. As shown in FIGS. 3(a–b), each substrate chuck docking fixture actuator employs a pneumatic cylinder to drive a hardened, polished stainless steel ball 23 into the appropriate vee-groove receptor 24, which is also constructed from hardened and ground stainless steel. The materials and dimensions of the balls 23 and vee-grooves 24 were chosen for their strength, impact resistance, and wear-resistance in order to ensure the accuracy and reliability of the mechanism. [Note: For higher performance, silicon nitride balls and/or vee-groove receptors may be used.] In order to maximize the repeatability of the engagement, each of the balls is mounted to a flexure mechanism, which absorbs much of the shock while maintaining positioning accuracy in a well-defined motion profile. Together, the three-ball and three-vee-groove interface form a kinematic engagement that has been demonstrated to have micron-level repeatability.

The glide and grip feature consists of an air-vacuum puck (see FIG. 6), onto which the substrate chuck 3 is mounted, and the grip/glide plate 4, which has the required flatness to enable each region of the substrate to remain at the same imaging plane no matter which region is presented for exposure. Note that the grip/glide plate is designed to provide a sufficient area over which the substrate can index while maintaining a high stiffness under severe weight limitations (due to the stage payload). As shown in FIG. 5(a), the air-vacuum puck is normally rigidly gripped to the grip/glide plate 4 by vacuum. When the substrate chuck 3 is engaged by the substrate chuck docking fixture actuators, as in FIG. 5(b), the vacuum is turned off (the puck is disengaged) and the air is turned on so that the puck "floats" on a cushion of air. For purposes of illustration, the air gap is exaggerated in FIG. 5b. In reality, the gap is on the order of 10 microns. During the time that the substrate chuck 3 is floating on the puck's air bearing during glide mode, the rest of the scanning carriage, including the grip/glide plate 4, moves (glides) underneath the air-vacuum puck to effect a relative change in the position of the mask and substrate. The arrows in grip/glide plate 4 indicates that the relative motion is provided by moving the grip/glide plate 4, not the substrate chuck 3 which is fixed in space during moves. Finally, as shown in FIG. 5c, the puck vacuum is re-applied, the air turned off, and the substrate chuck docking fixture actuators are disengaged (retracted). At this point, the substrate is ready for the exposure of a new module.

The indexing technology allows the user to pattern modules of various sizes on a single standard substrate, thereby simplifying the handling issues for the rest of the processing steps. Given the micron-level repeatability of the indexing mechanism, it is possible to perform a single, global alignment of the entire mask and substrate and eliminate time spent on site-by-site alignment for some products. Additionally, the technology allows the user to share the processing of several low-volume products on a high-volume carriage. Finally, the indexing technology enables the user to employ a mask where the size of the mask is driven by the size of each module. Decreasing mask size makes the manufacturing process more economical and robust.

FIG. 2 shows how the system accesses a sequence of substrate modules. FIG. 2(a) shows substrate 11 (simplified to a four-module substrate), mask 12, scanning carriage 13 (shown schematically), stage footprint 14 (shown schematically), and the positions respectively of illumination beam 15 and exposure beam 16. Exposure beam 16 position is shown as a spot centered at the intersection of the four modules of the substrate 11. Illumination beam 15 position is shown at the lower right corner of the mask.

FIG. 2(b) shows module 11-1 fully exposed, with the illumination beam and the exposure beam positions ready for patterning of the next module according to mask 15. Note that the stage footprint 17-1 shows a 1-module-length motion of the scanning carriage to the right.

FIG. 2(c) shows module 11-2 fully exposed, with the illumination beam and the exposure beam positions ready for patterning of the next module according to mask 12. Note that the stage footprint 17-2 shows a 1-module-length motion of the scanning carriage downward, plus a 1-module-length motion of the scanning carriage to the left.

FIG. 2(d) shows module 11-3 fully exposed, with the illumination beam and the exposure beam positions ready for patterning of the last module according to mask 12. Note that the stage footprint 17-3 shows a 1-module-length motion of the scanning carriage to the right.

FIGS. 3(a) and 3(b) respectively show the substrate chuck docking fixture during grip mode and during glide mode. The substrate chuck docking fixture comprises pneumatic linear 10 actuators 7, 8 and 9, of which pneumatic actuator 7 is representative. Pneumatic linear actuator 7 is mounted on angle bracket 21, and includes pneumatic chamber 22. Operating pneumatic linear actuator 7 between retracted position grip mode, shown in FIG. 3(a), and extended mode, shown in FIG. 3(b), engages kinematic engagement balls 23 into contact with the substrate chuck veegroove receptor 24. Switching vacuum to substrate chuck 3 grips the substrate chuck 3 into place; releasing the vacuum and substituting mild positive air pressure releases the substrate chuck which is then free to glide on an air cushion.

FIGS. 3(a) and 3(b) give detail of the pneumatic actuators 7, 8 and 9, their suspension, and their locating brackets 21. The ball 23 must be precisely located in its socket to fulfill its role in the kinematic engagement; the ball 23 must be retained to prevent it falling out when raised out of contact. In addition, the highly repetitive planned operation of the kinematic engagement in this environment, together with the demands for high resolution required by the microelectronics to be patterned, require wear-resistance well beyond the usual. Accordingly, balls and vee-groove receptors are made of carefully ground, hardened and polished stainless steel (or silicon nitride), and the balls are equipped with special shock-resistant flexures. The special flexures 25–27 are shown in FIGS. 3(a) and 3(b). Flexure bracket 25 is a stiff plate extending outward to an elbow, with an aperture to provide clearance for stop screw 27, and with flexural strip 28 mounted at the distal end to form an elbow. Spring 27(s) and the flexed flexural strip 28 provide the small return force required to lift the ball; the pneumatic actuator 7 has its own return spring. The major function of the flexural strip 28 is to provide very high positional guidance accuracy to ball 23 movement, beyond the accuracy of the pneumatic actuator 7, which is limited by the need for operating clearance for its piston 7(p).

Figure 4:
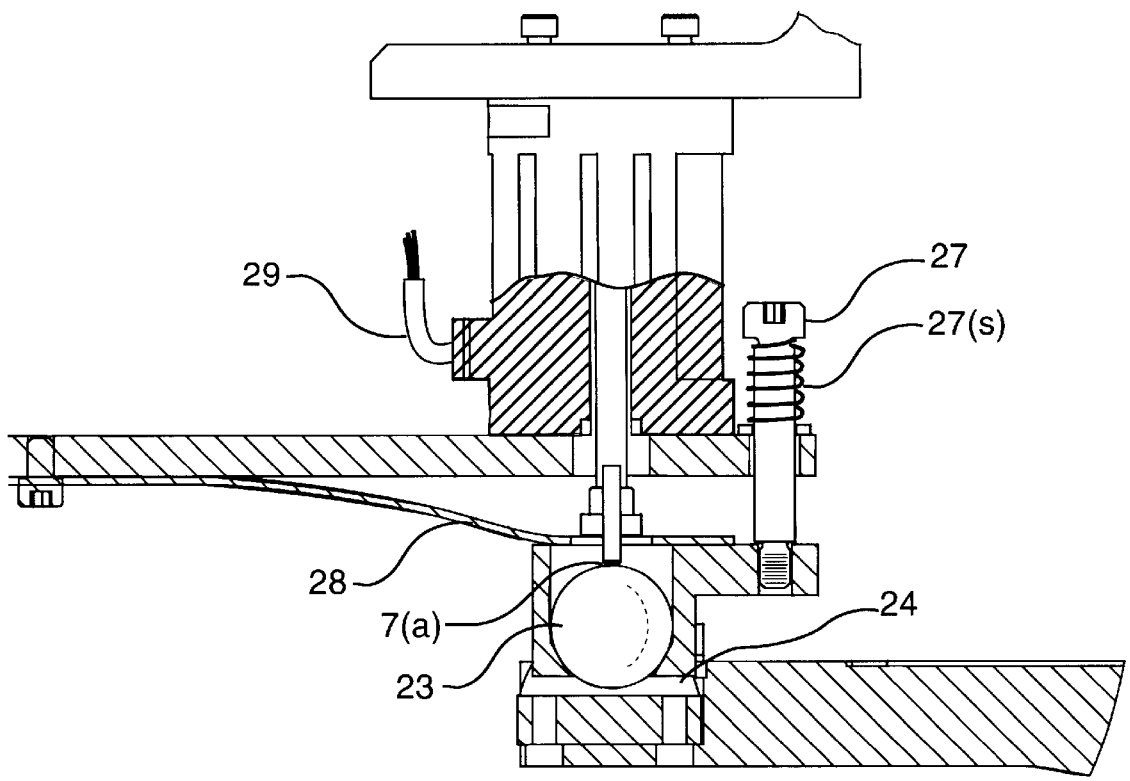
FIG. 4 is a stylized front view of the substrate chuck of the invention.

FIG. 4 supplements FIGS. 3(a) and 3(b), showing details of the ball retainer 26 and flexural strip 28 in the flexure mechanism. Flexural strip 28 has a cut-out so as to be out of contact with nut 29 of the pneumatic actuator piston extension 7(a). Pneumatic actuator piston extension 7(a) preferably is a short threaded steel post which is screwed into a threaded socket at the end of the actuator piston. The distal end of the pneumatic actuator piston extension 7(a) is hardened to a hardness of the same order as the hardness of the ball 23 which it contacts. The ball 23 is gripped in place against the hardened end of the pneumatic piston extension 7(a). The pneumatic actuator piston extension 7(a) has a threaded midsection, allowing adjustment by adjusting nut 29 so as to provide continuous contact with the respective ball 23. Spring 27-1, which biases the flexure plate 28 for ball 23 retraction, as shown in FIG. 3(a), provides power for ball retraction.

Figure 5:
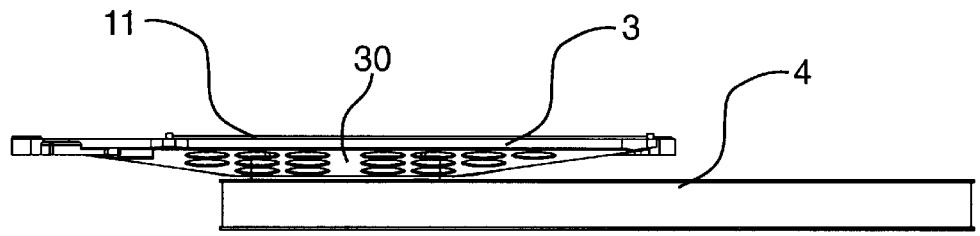
FIGS. 5a–5d is a perspective view showing how a substrate chuck docking fixture is aligned on the grip/glide plate.
Figure 5:
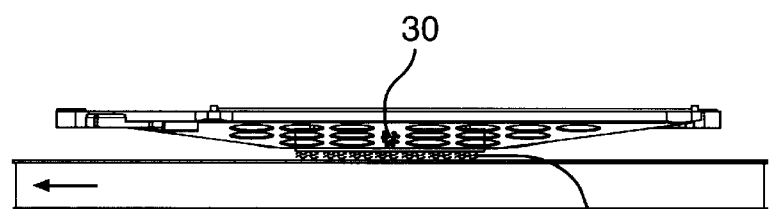
Figure 5:
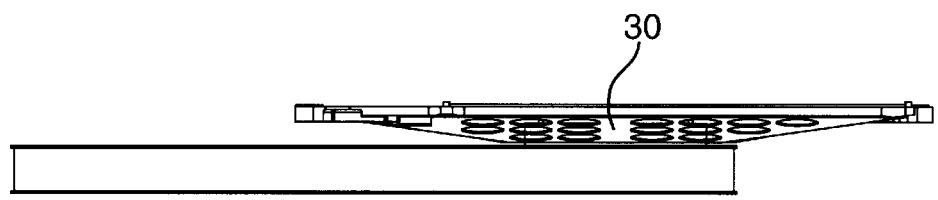
Figure 5:
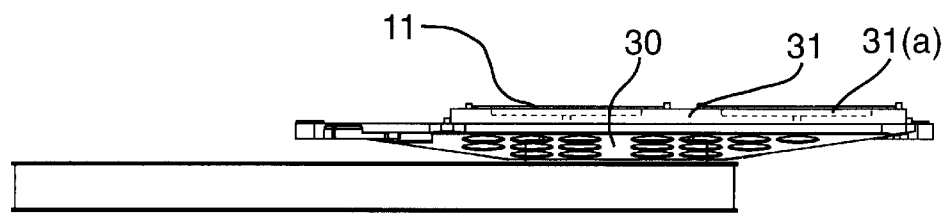

FIGS. 5(a–d) show details of the substrate chuck 3 support on the grip/glide plate 4. This surface, preferably a smooth impenetrable surface on composite material, serves as base for an air bearing during glide mode, and as a base for a vacuum grip during grip mode. Grip/glide plate 4 is mounted above stage carriage 5, which suffers a trade-off between stiffness and lightness due to the payload limitations of the stage. Stage carriage 5 is mounted on stage carriage 6, which is the movable part of stage 10.

The resolution being demanded (micron-level features) requires a very high rigidity of the bridge. The bridge must support the substrate chuck docking fixture actuators (7–9) suspended out of the way of the action. For a change of module, the stage carriage returns to docking position, the substrate chuck docking fixture actuators (7–9) operate, locating the substrate chuck 3 with precision, and then hold the substrate chuck 3 in kinematic engagement while the stage carriage glides across the grip/glide plate 4 on its air bearing, to a new module position. The system then switches to grip mode to take control of the repositioned substrate chuck 3, still with great precision. The kinematic engagement ends, as the substrate chuck 3, still immobilized in X, Y and Theta, switches to from glide mode to grip mode by switching its puck from air to vacuum. This transfers positioning control smoothly from substrate chuck docking fixture to stage carriage. The substrate chuck 3 puck uses vacuum to grip the grip/glide plate 4. Actuators 7–9 retract, releasing the substrate chuck, and the balls are lifted to provide clearance for scanning motions or other operations.

FIGS. 5(a, b & c) show details of the air bearing substrate chuck 3 in operation. The substrate chuck 3 is carried on the air bearing surface of grip/glide plate 4, where in FIG. 5(a) it is shown in grip mode, gripped by vacuum, with the air bearing substrate chuck 3 cantilevered out from the left extremity of grip/glide plate 4. The vacuum is illustrated by the vacant chamber 30, which connects through a number of channels to all areas of the substrate-contacting operating surface of the substrate chuck 3. See FIG. 6. The cantilevering is a trade-off of stiffness to weight; it is important to keep weight minimized on the moving stage carriage.

FIG. 5(b) shows the air bearing substrate chuck 3 while the stage is moving the air bearing surface plate 4 through the position shown, with the substrate chuck 3 centered, to the position shown in FIG. 3(c). The substrate chuck 3 is shown in glide mode in FIG. 3(b), with air flowing out under positive pressure to provide an air bearing between the flat central portion of the truncated pyramid substrate chuck 3. This flat portion is called the "puck," and appears in FIG. 6 as items 33(a), 33(b) and 33(v). Airflow from the puck provides an air bearing for the glide mode. Note that in glide mode the positive air is valved "on" at puck glide areas 33(a) and 33(b)—and that in grip mode the positive air is valved "off" at puck areas 33(a) and 33(b). Vacuum at puck area 33(v) is turned on in grip mode.

FIG. 5(c) shows the motion completed, in grip mode with the substrate chuck 3 gripped by vacuum cantilevered out from the right extremity of air hearing surface plate 4.

FIG. 5(d) shows an additional embodiment, featuring a substrate frame 31 which may be installed manually on the substrate chuck, against three locating pins. Automatic installation is also possible. Economics and manufacturing convenience may be enhanced by supplementing the substrate chuck 3 with a set of substrate frames. One or several substrates 11 may be pre-positioned in individual positions on one substrate frame, each registered against three locating pins. The substrate frame 31 has air/vacuum channels 31(a) to transmit airflow to both substrate frame 31 and its load of substrates 11, for grip/glide functions. The substrate frame 31 eases the process of alignment, and provides for possible cartridge-feed, thus easing the time-overhead of blank-substrate resupply to the costly image-patterning system.

Substrate frame 31 allows the flat operating surface of the substrate chuck 3 to take a vacuum grip on substrate frame 31 and, via the substrate frame 31, on each of the one or more substrates 11 which it holds. The substrate frame 31 loads onto the substrate chuck much like substrate loading, providing a repeatable position relationship with the substrate chuck.

Figure 6:
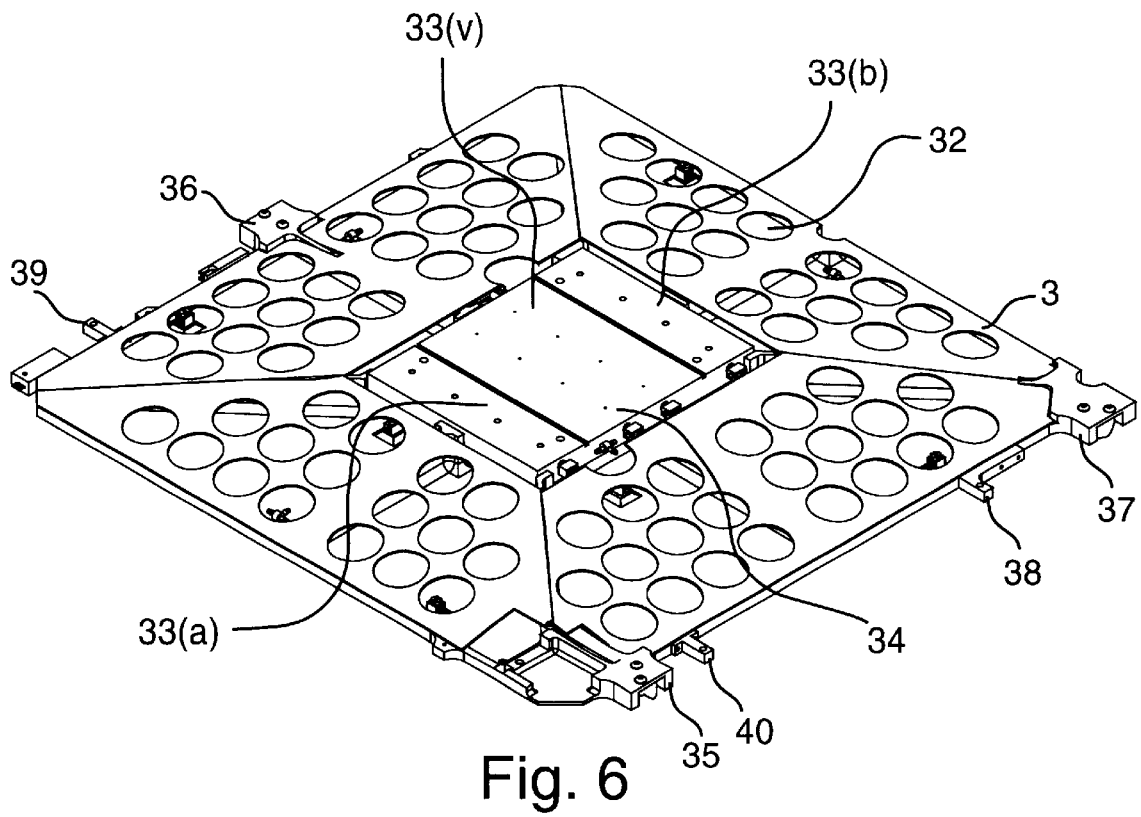
FIG. 6 is a bottoms-up perspective of the substrate chuck, showing details of the air/vacuum puck, attachment and alignment brackets and weight-reduction techniques.

FIG. 6 is a bottoms-up perspective of the substrate chuck 3, showing details of weight-reduction techniques including holes 32, the pressure/vacuum puck 33, and adjusters and attachment brackets 34–40 for position sensors and other items. The substrate chuck 3 is an inverted truncated pyramid, with the puck 33 forming a flat bottom for grip and glide functions. For grip mode, vacuum at puck grip area 33(v) grips the puck down to the air bearing surface plate 4. For glide mode, air under pressure at puck glide areas 33(a) and 33(b) floats the substrate chuck 3, puck area only, on a thin film of air on the air bearing surface plate 4. Note that the substrate chuck 3 is also held in place by the kinematic engagement during glide mode. The essence of glide mode is that the substrate is under complete control, fixed in space in its substrate chuck 3 which is held by the activated kinematic engagement of the substrate chuck docking fixture. Actual vertical motion of the substrate chuck 3 is on the order of ten microns, the thickness of its air bearing when in glide mode. The thickness of the air bearing is only sufficient to support a gliding motion of the substrate chuck 3 puck 33 on the grip/glide plate 4

Figure 7:
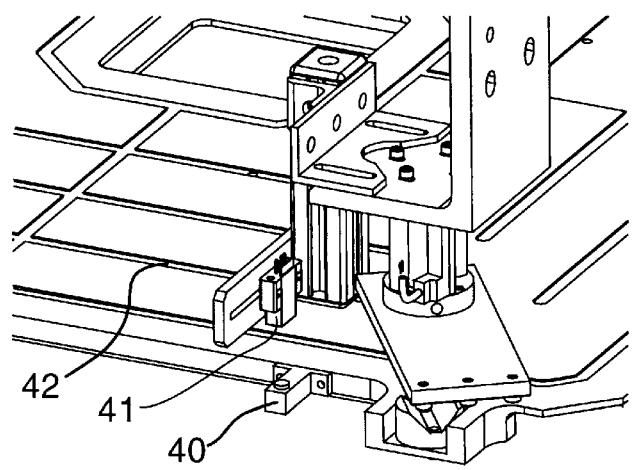
FIG. 7 is a detail showing a representative alignment mechanism for the substrate chuck and showing detail of vacuum airflow channels for holding the substrate to the substrate chuck.

FIG. 7 is a detail showing a representative alignment mechanism for the substrate chuck. An optical spot sensor 41 views the locating spot on bracket 40, and provides sensing signals to the control mechanism.

Figure 8:
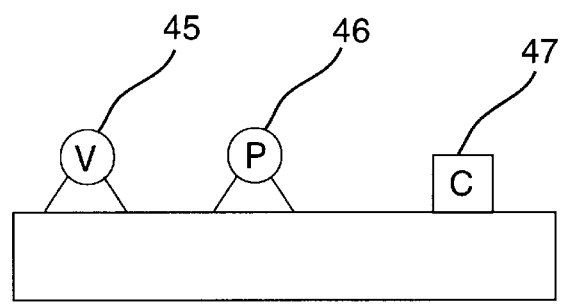
FIG. 8 is a schematic diagram showing sources of vacuum, air under pressure, and electronic control.

FIG. 8 is a schematic diagram showing sources of vacuum 45, air pressure supply 46, and electronic control unit 47. While these items must be of high quality and dependable, they may be quite standard except for adjustment and programming. Vacuum is at approximately negative 0.9 atmosphere; pressure is approximately 5 atmospheres. In the preferred embodiment, vacuum at the interface between substrate 11 and the surface of substrate chuck 3 is valved on/off for loading/unloading, vacuum at the puck surface 33(v) is valved on/off for grip mode/glide mode, and the pressure air to puck surfaces 33(a) and 33(b) is valved on and off, respectively, for glide mode and grip mode.

Summary

The system requires great rigidity and great dimensional stability to provide repeatable exact location to a variable area substrate tiling system for a number of individually scanned modules of a large substrate. The large substrate sits in a substrate chuck 3 which is mounted on an X-Y stage 10. The X-Y stage 10 has a scanning travel envelope significantly smaller than the substrate. The X-Y stage must dependably move the substrate, in the scanning pattern with respect to a projection lens and related optics, permitting the patterning by a very small field on a large module of a very large substrate. The small field allows for the highest resolution available from the optics. The bridge must suspend the optics above the moving X-Y stage, providing space for scanning motions while avoiding the results of vibration and motion dynamics. The bridge also suspends the fixed elements of a kinematic engagement which serves as a substrate chuck docking fixture. The substrate chuck docking fixture temporarily locates the substrate chuck for a glide mode operation which allows the stage to move under the gliding substrate chuck. The substrate chuck 3 releases its vacuum grip to the air-bearing plate 4 of the X-Y stage, and its air bearing is activated. The X-Y stage moves under the docked substrate chuck, which glides free of the X-Y stage on a temporary air bearing, so that the X-Y stage may move freely to address the substrate chuck 3 in a new module position. When the new module position is reached, the substrate chuck 3 regains its hold on the grip/glide plate 4 at the new module position. The operational result is the regaining of access to the substrate, at a new module position, for patterning the new module in a set of scanning motions by the X-Y stage. The substrate chuck docking feature creates economical manufacturability of lithographic technology of the type featuring overlapping complementary polygonal scans, using a very small image field, to carry out the patterning function at very high resolution, over a large number of substrate modules, in a very large, multi-module, substrate.

What is claimed is:

1. A demountable substrate frame (31), for use with a dockable substrate chuck having a substrate-frame-accepting operating surface, in a system for processing of a large-area microelectronics substrate by radiation projected by an optical subsystem in a small object field to scan a module within a multi-module active area of the substrate as the substrate moves, on an X-Y stage, characterized by: a planar body, having parallel substrate-accepting operating surface and supporting surface for supporting at least one substrate subject to being gripped by airflow through the dockable substrate chuck;

airflow distribution means, at the substrate-accepting operating surface of said planar body, for providing a grip to a substrate by vacuum from dockable substrate chuck to said substrate-accepting operating surface; and means for providing repeatable position relationship with the dockable substrate chuck.

* * * * *